(12) United States Patent
Fricke et al.

(10) Patent No.: US 8,773,136 B2
(45) Date of Patent: Jul. 8, 2014

(54) METHOD FOR EVALUATING THE ABILITY OF A BATTERY TO START

(75) Inventors: Birger Fricke, Aachen (DE); Mark Eifert, Frankfurt am Main (DE); Ralf Hecke, Aachen (DE); Eckhard Karden, Aachen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 387 days.

(21) Appl. No.: 13/252,477

(22) Filed: Oct. 4, 2011

(65) Prior Publication Data

US 2012/0081127 A1 Apr. 5, 2012

(30) Foreign Application Priority Data

Oct. 4, 2010 (DE) .......................... 10 2010 041 921

(51) Int. Cl.
*G01N 27/416* (2006.01)
*B60W 20/00* (2006.01)

(52) U.S. Cl.
CPC ............. *B60W 20/00* (2013.01); *Y10S 903/903* (2013.01)
USPC .......................................... 324/433; 903/903

(58) Field of Classification Search
CPC ..... B60W 20/00; B60W 10/06; B60W 10/26; B60W 2710/086; B60W 2710/244; B60W 30/18018; Y10S 903/903; F02N 2200/061; F02N 2200/062; H01M 2220/20

USPC .......................................................... 324/433
See application file for complete search history.

(56) References Cited

U.S. PATENT DOCUMENTS

| 6,732,043 | B2 | 5/2004 | Schoch |
| 2001/0028233 | A1* | 10/2001 | Omata et al. ................... 318/445 |
| 2002/0019691 | A1* | 2/2002 | Matsubara et al. ............. 701/54 |
| 2002/0082765 | A1 | 6/2002 | Schoch |
| 2006/0091848 | A1* | 5/2006 | Braun et al. ................... 320/104 |

FOREIGN PATENT DOCUMENTS

EP 1207297 A2 5/2002

* cited by examiner

*Primary Examiner* — Arun Williams
(74) *Attorney, Agent, or Firm* — Frank A. MacKenzie; Brooks Kushman P.C.

(57) ABSTRACT

The charge state of a battery powering a starter of a motor vehicle is evaluated to determine whether the battery voltage is sufficiently high to re-start an internal combustion engine during a stop/start operating mode. The engine is operated to drive a generator so that the generator output voltage is at a level below a setpoint value for a time period. At the end of the time period, the battery voltage is measured and if it exceeds a threshold voltage the battery charge state is determined to be sufficient to re-start the engine. The threshold voltage is approximately equal to the rated battery voltage. If the measured battery voltage is below the threshold voltage value, indicating that the battery will not have sufficient charge to re-start the motor, automatic shut-off of the engine when the vehicle stops is suppressed.

13 Claims, 3 Drawing Sheets

METHOD FOR EVALUATING THE ABILITY OF A BATTERY TO START

CROSS-REFERENCE TO RELATED APPLICATIONS

This application claims foreign priority benefits under 35 U.S.C. §119(a)-(d) to DE 10 2010 041 921.4 filed Oct. 4, 2010, which is hereby incorporated by reference in its entirety.

TECHNICAL FIELD

The invention relates to a method and to an arrangement for ascertaining the ability of a starter battery of an internal combustion engine to continue to supply power during a stop/start operating mode of the internal combustion engine.

BACKGROUND

In motor vehicles with a stop/start functionality, the internal combustion engine can be automatically stopped, that is to say switched off, when no propulsion power is required (for example when waiting at a stoplight), and automatically restarted, that is to say started up, when the driver requests propulsion power again. A stop/start operating mode of this kind reduces fuel consumption and noise emissions.

Stop/start systems have to ensure that the starter battery can maintain a voltage which is sufficient both for the current consumption in the motor vehicle during the stop phase and for restarting the internal combustion engine, after the internal combustion engine has automatically stopped. Many start/stop systems make use of a battery monitoring system which continuously measures the current flowing into and out of the battery and integrates the measurement signal, in order to obtain from this the charge state of the starter battery. If the charge state meets a predefined criterion, it is assumed that the battery can supply the required voltage. However, current measurement requires a current sensor, usually either a branch current sensor or a Hall sensor. Both types of sensor are relatively complex and add significantly to the costs of the stop/start system. In addition, it may be expedient for structural reasons to use a dedicated controller for the battery monitoring system, but this entails additional expenditure, especially since communications lines for connecting to other controllers are required.

EP 1 207 297 A2 discloses a method and an arrangement for ascertaining the ability of the starter battery of an internal combustion engine with a stop/start functionality to start, with the ability to start being estimated on the basis of the voltage drop across the starter battery which occurs during starting of the internal combustion engine. To this end, the charge state of the starter battery also has to be known, this being ascertained by a battery monitoring system.

SUMMARY

The invention is based on the problem of providing a method and also an arrangement with which the ability of the starter battery of an internal combustion engine to start in the stop/start operating mode can be ascertained in a particularly simple and reliable manner.

According to a disclosed embodiment, the charge state of a battery powering a starter of a motor vehicle is evaluated to determine whether the battery voltage is sufficiently high to re-start an internal combustion engine during a stop/start operating mode. The evaluation is made by operating the engine to drive a generator so that the generator output voltage is at a reduced value lower than a setpoint value for a time period. At the end of the time period, the battery voltage is measured and compared with a threshold voltage value. If the measured battery voltage exceeds the threshold voltage the battery charge state is determined to be sufficient to re-start the engine. If the battery charge state is determined to be below the threshold voltage value, indicating that the battery will not have sufficient charge to re-start the motor, automatic shut-off of the engine when the vehicle stops is suppressed.

BRIEF DESCRIPTION OF THE DRAWINGS

Embodiments of the present invention will now be described by way of example only with reference to the accompanying drawings in which.

DETAILED DESCRIPTION

Figure 1:
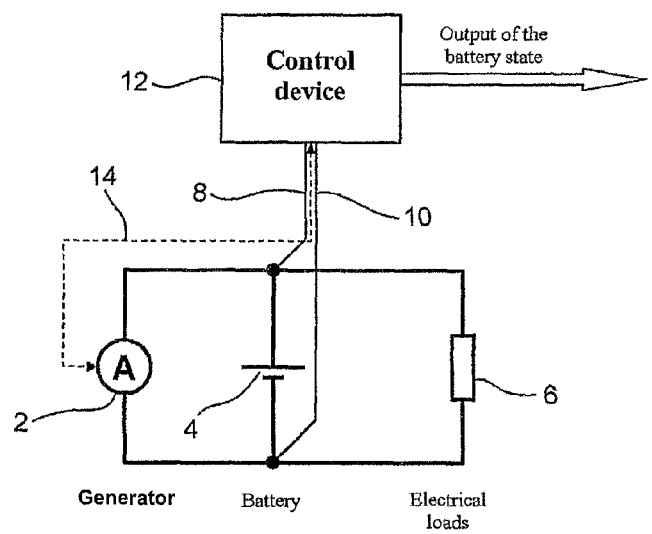
FIG. 1 shows a general circuit diagram of an arrangement for ascertaining the ability of the starter battery of an internal combustion engine to start in the stop/start operating mode.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The present invention makes use of the fact that electrical alternators or generators which convert mechanical energy from the internal combustion engine into electrical energy nowadays generally have an integrated electronic system which allows the output voltage of the generator to be adjusted, with the generator keeping its voltage constant as long as the electrical loading on said generator does not exceed the mechanical energy which is supplied to said generator.

The use of a generator of this kind, which can optionally also be used in phases as an electric motor for assisting propulsion of the vehicle and/or as a starter, permits a new, direct method for identifying the ability of the starter battery to continue to supply power during the stop/start operating mode of the vehicle.

The output voltage of the generator is first reduced from a setpoint value, which may be, for example, 14 V in a 12 volt on-board electrical system, to a reduced value while the internal combustion engine is running This reduced value is preferably firstly selected to be low enough that the battery is discharged by the load(s) of the on-board electrical system, and secondly selected to be high enough that all the loads on the on-board electrical system can continue to be operated by the generator. A suitable reduced value in a 12 volt on-board electrical system may be, for example, 11 V or less.

Lowering the output voltage of the generator reduces the battery voltage initially quickly, and then more slowly, to a value which corresponds to the loads and which no longer changes to a significant degree after a time period. Typically, the time period required for the battery voltage to stabilize is a few seconds.

Once the battery voltage has stabilized to a sufficient degree, for example three seconds after the output voltage of the generator is lowered, the battery voltage is measured and compared with a predetermined threshold value which may be selected substantially as the rated value of the battery voltage which is, for example, 12 V in a 12 volt on-board electrical system. After this time period of, for example, three seconds has elapsed, the output voltage of the generator being reduced during said period of time, said output voltage can be returned to its setpoint value.

If the battery voltage which is measured at the reduced output voltage of the generator is greater than the predetermined threshold value, the ability of the battery to start is judged to be sufficient, and the internal combustion engine is allowed to be automatically stopped the next time the vehicle stops, for example at a stoplight. Otherwise, automatic stopping of the internal combustion engine is suppressed.

The above procedure can be carried out when the vehicle is moving, and therefore it is possible for the internal combustion engine to be immediately stopped when the vehicle stops at a stoplight and the charge state of the battery has been assessed as being sufficient to ensure power is supplied both to the loads while the engine is stopped and also to the starter in the event of subsequent restarting.

This strategy reliably ensures that the battery is not discharged between two stopping instances. Since the operating conditions, in particular the charge state and the temperature of the battery and also the loading by all the loads on the on-board electrical system, does not normally change rapidly or continuously, it is not necessary to lower the output voltage of the generator for each stop/start event but, for example, only at the beginning of a new journey or after relatively long time intervals.

In the interim, it is sufficient to compare the battery voltage which is measured at the end of the preceding engine-stopping event, instead of the battery voltage which is measured at the generator of which the output voltage has been lowered, with the predetermined threshold value for each engine-stopping event.

The method according to the invention is not directed at any absolute value of the charge state of the battery, as the prior art attempts to ascertain, but rather inherently also takes into account influences such as the actual current requirement in the on-board electrical system and the temperature of the starter battery which are additionally ascertained in the prior art and are used, together with the battery charge state, to determine the actual ability to start. Therefore, the method according to the invention is significantly simpler and more reliable and more robust.

In contrast to known methods which require current measurement in the start phase, the method according to the invention can be carried out while the vehicle is moving, preferably when it is slowing down and therefore is expected to come to a standstill at a stoplight. The method according to the invention therefore also provides a reliable result at the end of a relatively long, uninterrupted journey.

As shown in FIG. 1, a generator 2 having an adjustable output voltage, a battery 4 which serves as a starter battery and also electrical loads 6 are, in principle, connected in parallel in a motor vehicle. A pair of voltage measuring lines 8 and 10, which are connected to the two poles of the parallel circuit, lead to a control device 12. In addition, a control line 14 (indicated by a dashed line) for transmitting control signals is provided between the generator 2 and the control device 12. The control line 14 can be of bidirectional design, with only the function of the control device 12 being able to adjust the output voltage supplied by the generator 2 being required for the purpose described here. The control device 12 ascertains the charge state of the battery 4 in the manner described in greater detail further below and outputs said charge state to an electronic control unit (not shown) of the vehicle.

The following explanation of the method which is carried out with the arrangement shown in FIG. 1 is made, by way of example, with reference to a 12 volt on-board electrical system. It is clear to a person skilled in the art that the method can be carried out with other on-board electrical system voltages; the manner in which this can be done is clear to a person skilled in the art too.

Figure 2:
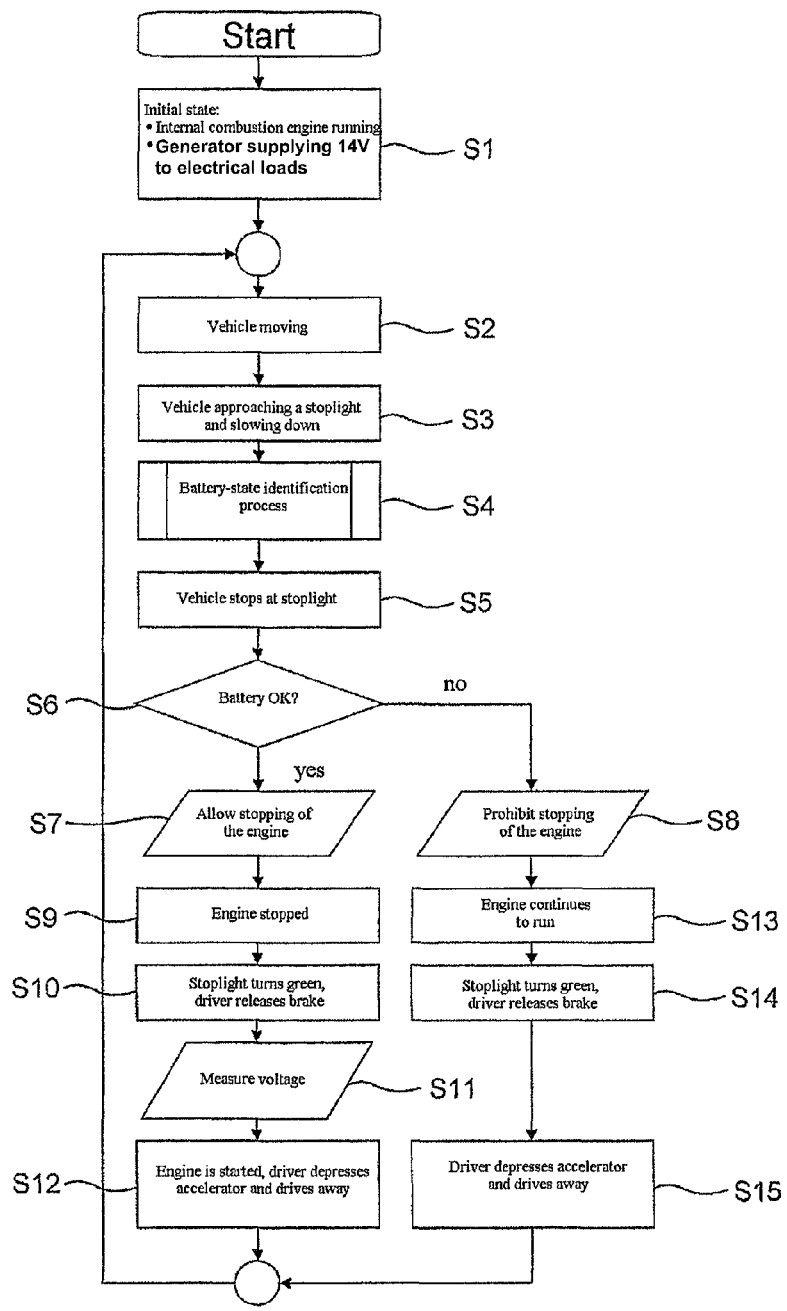
FIG. 2 shows a flowchart of a stop/start operation of an internal combustion engine taking into account the ascertained ability of the starter battery to start.

As shown in FIG. 2, the method begins in an initial state (S1) in which the internal combustion engine is running and the generator 2 supplies approximately 14 V to the electrical loads 6. When the vehicle is moving (S2), is approaching, for example, a stoplight and therefore slows down (S3), the battery-state identification process (S4) which is explained in greater detail further below is carried out. When the vehicle stops at the stoplight (S5), a decision is made (S6), on the basis of the result of the battery-state identification process (S4), to determine whether stopping of the engine is allowed (S7) or prohibited and suppressed (S8). When stopping of the engine is allowed and the engine stops (S9) and the stoplight later turns green and the driver releases the brake (S10), the actual battery charge state or voltage is measured (S11), before the engine is started and the driver depresses the accelerator and drives away (S12). When, in contrast, stopping of the engine is suppressed and the engine therefore continues to run (S13) and the stoplight turns green some time later and the driver releases the brake (S14), the actual battery voltage is not measured before the journey continues (S15). It goes without saying the above-described time for the battery-state identification process is not mandatory; said battery-state identification process can also be carried out, in principle, at specific time or distance intervals—given a corresponding driving state.

Figure 3:
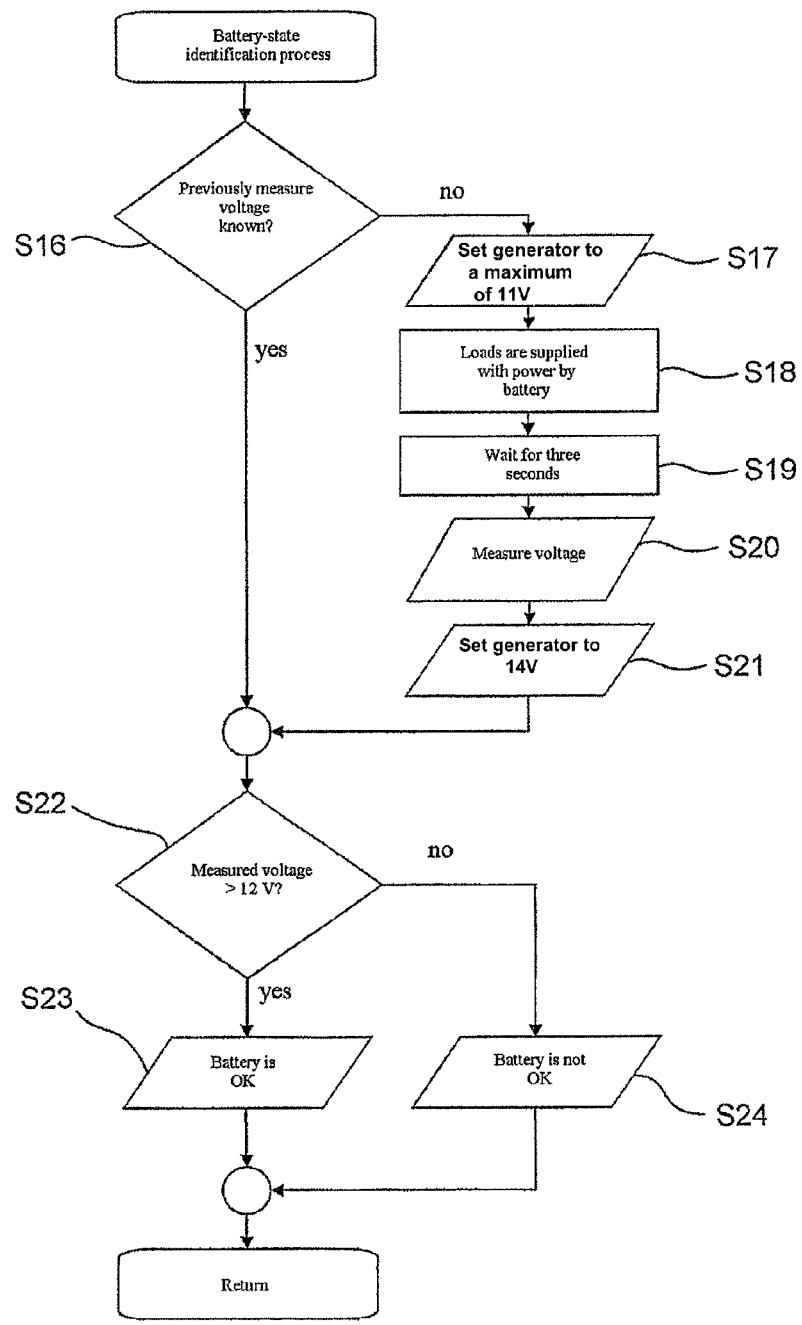
FIG. 3 shows a detailed flowchart of the battery-state identification process which is carried out as part of the stop/start operating mode of FIG. 2.

The battery-state identification process in block S4 of FIG. 2 is carried out in the manner shown in FIG. 3. A check is made in step S16 to determine whether the battery voltage which was measured last in step S11 of FIG. 2 is known. If not, or if this is an obsolete value, the output voltage of the generator 2 is adjusted to a reduced value lower than its setpoint value of 14 V, for example to a maximum of 11 volts. As a result, the loads 6 are still only supplied with power by battery 4 (S18). After a desired time period (three seconds in this example) (S19), the battery voltage is measured (S20), and the output voltage of the generator 2 is again adjusted to the setpoint value of 14 V (S21).

After this, and also when the check in step S16 has shown that the previously measured battery voltage is known, a check is made in step S22 to determine whether the battery voltage previously measured in step S16 or the battery voltage just measured in step S20 is greater than the rated on-board electrical system voltage of 12 V. If so, the charge state of the starter battery is judged to be sufficient (S23), and if not, the charge state of the starter battery is judged to be insufficient (S24). The method then continues with step S5 in FIG. 2.

Figure 4:
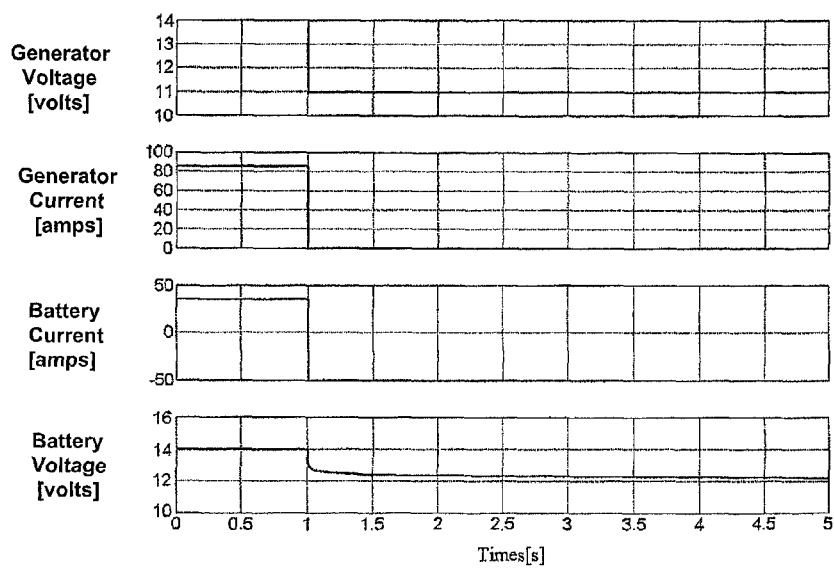
FIG. 4 shows timing diagrams of the voltages and currents which are provided by a generator and are measured across the starter battery.

In FIG. 4, the voltage at the generator 2, the current fed to the on-board electrical system by the generator 2, the battery current (charge current positive and discharge current negative) and the battery voltage during the course of the procedure shown in FIG. 3 are plotted in order from top to bottom over the same time interval of 5 seconds in graphs.

At the beginning, the generator 2 supplies an output voltage of 14 V. The generator 2 charges the battery 4 with approximately 30 A and furthermore supplies approximately 50 A to the loads 6. The total output current of the generator 2 is therefore somewhat more than 80 A.

At the one second mark (for purposes of example only), the output voltage of the generator 2 is reduced to 11 V. The generator 2 then does not charge either the battery 4 nor does it supply power to the loads 6. Instead, the battery has to supply approximately 50 A to the loads 6. The battery voltage drops as a result. At the expiration of a predetermined time period (three seconds, in this example) after the generator voltage is reduced, the battery voltage is measured and is found to have fallen to approximately 12.2 V. Since this measured value of battery voltage is above the rated on-board electrical system voltage of 12 V (the threshold voltage, in this example), the stop/start system is allowed to stop the internal combustion engine the next time the vehicle comes to a stop.

Stopping of the internal combustion engine normally leads to a reduction in the electrical loading on the battery since the current required for operating the internal combustion engine is not available. This is not shown in FIG. 4, and neither is the behavior of the generator voltage after the voltage comparison or after stopping of the engine.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for evaluating whether a charge state of a battery powering a starter of a motor vehicle is sufficient to re-start an internal combustion engine during a stop/start operating mode of the engine comprising the steps of:
   operating the engine to drive a generator to produce an output voltage at a reduced value lower than a setpoint value, the reduced value not greater than an upper limit at which that the battery is discharged by electrical loads powered by an electrical system of the vehicle, and the reduced value not less than a lower limit sufficient for the generator to power the electrical loads if the battery is unable to power the electrical loads;
   measuring a voltage of the battery at an end of a time period of a duration sufficient to allow the battery to reach a stabilized value; and
   determining that the battery charge state is sufficient to re-start the engine if the measured battery voltage exceeds a threshold voltage value.

2. The method of claim 1, wherein the reduced value is at least approximately 1 V below a rated battery voltage.

3. The method of claim 1, wherein the reduced value is at approximately 90% of a rated battery voltage.

4. The method of claim 1, wherein the threshold voltage value is approximately equal to a rated battery voltage.

5. The method of claim, 1 wherein if the measured battery voltage is lower than the threshold voltage value, the battery charge state is judged to be insufficient to re-start the engine.

6. The method of claim 1, wherein if the battery charge state is determined to be sufficient, the engine is allowed to be automatically stopped when the motor vehicle comes to a stop, and otherwise the automatic stopping of the engine is suppressed.

7. The method of claim 1, wherein the method is carried out while the motor vehicle is moving and before it is expected to come to a stop.

8. A method of operating a motor vehicle having an internal combustion engine during a stop/start operating mode of the engine comprising the steps of:
   operating the engine to drive a generator to produce an output voltage at a reduced value lower than a setpoint value for a time period, the reduced value not greater than an upper limit at which that a battery is discharged by electrical loads powered by an electrical system of the vehicle, and the reduced value not less than a lower limit sufficient for the generator to power the electrical loads if the battery voltage is too low to power the electrical loads;
   measuring a voltage of the battery at an end of the time period; and
   if the voltage of the battery is lower than a threshold value, preventing automatic stopping of the engine when the motor vehicle comes to a stop.

9. The method of claim 8, wherein the time period is selected to allow the battery voltage to reach a stabilized value.

10. The method of claim 8, wherein the reduced value is at least approximately 1 V below a rated battery voltage.

11. The method of claim 8, wherein the reduced value is at approximately 90% of the rated battery voltage.

12. The method of claim 8, wherein the threshold voltage value is approximately equal to a rated battery voltage.

13. The method of claim 8, wherein the method is carried out while the motor vehicle is moving and before it is expected to come to a stop.

* * * * *